US 8,558,105 B2

(12) United States Patent
Carroll et al.

(10) Patent No.: US 8,558,105 B2
(45) Date of Patent: Oct. 15, 2013

(54) ORGANIC OPTOELECTRONIC DEVICES AND APPLICATIONS THEREOF

(75) Inventors: David Loren Carroll, Winston-Salem, NC (US); Jiwen Liu, Winston-Salem, NC (US); Manoj A. G. Namboothiry, Winston-Salem, NC (US)

(73) Assignee: Wake Forest University, Winston Salem, NC (US)

( * ) Notice: Subject to any disclaimer, the term of this patent is extended or adjusted under 35 U.S.C. 154(b) by 240 days.

(21) Appl. No.: 12/298,942

(22) PCT Filed: May 1, 2006

(86) PCT No.: PCT/US2006/016730
§ 371 (c)(1),
(2), (4) Date: Oct. 29, 2008

(87) PCT Pub. No.: WO2007/130025
PCT Pub. Date: Nov. 15, 2007

(65) Prior Publication Data
US 2009/0173372 A1    Jul. 9, 2009

(51) Int. Cl.
*H01L 31/00*    (2006.01)
*H01L 21/00*    (2006.01)

(52) U.S. Cl.
USPC ............ 136/256; 136/259; 136/263; 438/82; 438/98

(58) Field of Classification Search
CPC ............... H01L 31/022416; H01L 31/035281; H01L 31/0422; H01L 51/0032; H01L 51/0097; H01L 51/447
USPC ............ 136/244, 252, 256, 259, 263; 438/64, 438/82, 98
See application file for complete search history.

(56) References Cited

U.S. PATENT DOCUMENTS

| 4,217,148 A * | 8/1980 | Carlson .................... 136/255 |
| 4,913,744 A | 4/1990 | Hoegl et al. |
| 6,093,757 A * | 7/2000 | Pern ......................... 524/99 |
| 6,340,789 B1 | 1/2002 | Petritsch et al. |
| 6,399,873 B1 * | 6/2002 | Sano et al. ................ 136/249 |
| 6,420,031 B1 | 7/2002 | Parthasarathy et al. |
| 6,538,375 B1 | 3/2003 | Duggal et al. |
| 6,576,341 B1 | 6/2003 | Davey et al. |
| 6,580,027 B2 | 6/2003 | Forrest et al. |

(Continued)

FOREIGN PATENT DOCUMENTS

| DE | 69908016 | 8/2004 |
| EP | 0 949 199 A1 | 10/1999 |

(Continued)

OTHER PUBLICATIONS

Huynh et al. Adv. Mater. 1999, 11, No. 11, pp. 923-928.*

(Continued)

*Primary Examiner* — Eli Mekhlin
(74) *Attorney, Agent, or Firm* — J. Clinton Wimbish; Smith Moore Leatherwood LLP

(57) ABSTRACT

The present invention provides organic optoelectronic devices including organic photovoltaic devices. In an embodiment, the present invention provides an organic optoelectronic device comprising a fiber core, a radiation transmissive first electrode surrounding the fiber core, at least one photosensitive organic layer surrounding the first electrode and electrically connected to the first electrode, and a second electrode surrounding the organic layer and electrically connected to the organic layer.

59 Claims, 9 Drawing Sheets

(56) References Cited

U.S. PATENT DOCUMENTS

| | | | |
|---|---|---|---|
| 6,657,378 B2 | 12/2003 | Forrest et al. | |
| 6,667,360 B1* | 12/2003 | Ng et al. | 524/492 |
| 6,946,597 B2 | 9/2005 | Sager et al. | |
| 7,026,079 B2 | 4/2006 | Louwet et al. | |
| 7,194,173 B2* | 3/2007 | Shtein et al. | 385/128 |
| 7,358,291 B2 | 4/2008 | Curran et al. | |
| 2002/0160553 A1* | 10/2002 | Yamanaka et al. | 438/149 |
| 2002/0189666 A1* | 12/2002 | Forrest et al. | 136/263 |
| 2003/0006401 A1 | 1/2003 | Haghighat et al. | |
| 2003/0035979 A1 | 2/2003 | Chen et al. | |
| 2003/0096113 A1 | 5/2003 | Jacobson et al. | |
| 2003/0099858 A1 | 5/2003 | Duggal et al. | |
| 2003/0136943 A1 | 7/2003 | Alivisatos et al. | |
| 2003/0168756 A1 | 9/2003 | Balkus, Jr. et al. | |
| 2003/0178607 A1 | 9/2003 | Swager et al. | |
| 2004/0102577 A1 | 5/2004 | Hsu et al. | |
| 2004/0118448 A1* | 6/2004 | Scher et al. | 136/252 |
| 2004/0124504 A1 | 7/2004 | Hsu | |
| 2004/0127637 A1 | 7/2004 | Hsu et al. | |
| 2004/0187911 A1 | 9/2004 | Gaudiana et al. | |
| 2004/0187917 A1 | 9/2004 | Pichler | |
| 2004/0202436 A1* | 10/2004 | Cho et al. | 385/123 |
| 2004/0241900 A1 | 12/2004 | Tsukamoto et al. | |
| 2004/0256001 A1 | 12/2004 | Mitra et al. | |
| 2005/0009224 A1 | 1/2005 | Yang et al. | |
| 2005/0042556 A1 | 2/2005 | Louwet et al. | |
| 2005/0056815 A1 | 3/2005 | Miteva et al. | |
| 2005/0061363 A1 | 3/2005 | Ginley et al. | |
| 2005/0074706 A1 | 4/2005 | Bristol et al. | |
| 2005/0110145 A1 | 5/2005 | Elers | |
| 2005/0159581 A1 | 7/2005 | Vanderzande et al. | |
| 2005/0189014 A1 | 9/2005 | Gaudiana et al. | |
| 2005/0209388 A1 | 9/2005 | Hsu et al. | |
| 2005/0211293 A1 | 9/2005 | Enomoto et al. | |
| 2005/0211294 A1 | 9/2005 | Chittibabu et al. | |
| 2005/0224788 A1 | 10/2005 | Hsu et al. | |
| 2005/0236035 A1 | 10/2005 | Yang et al. | |
| 2005/0257827 A1 | 11/2005 | Gaudiana et al. | |
| 2005/0263178 A1 | 12/2005 | Montello et al. | |
| 2005/0263179 A1 | 12/2005 | Gaudiana et al. | |
| 2005/0263180 A1 | 12/2005 | Montello et al. | |
| 2005/0268962 A1 | 12/2005 | Gaudiana et al. | |
| 2005/0274408 A1 | 12/2005 | Li et al. | |
| 2006/0005876 A1 | 1/2006 | Gaudiana et al. | |
| 2006/0013549 A1 | 1/2006 | Shtein et al. | |
| 2006/0021647 A1 | 2/2006 | Gui et al. | |
| 2006/0027834 A1 | 2/2006 | Forest et al. | |
| 2006/0076048 A1 | 4/2006 | Gaudiana et al. | |
| 2006/0079626 A1 | 4/2006 | Curran et al. | |
| 2006/0090791 A1 | 5/2006 | Gaudiana et al. | |
| 2006/0096633 A1 | 5/2006 | Chu | |
| 2006/0107997 A1 | 5/2006 | Matsui et al. | |
| 2006/0118768 A1 | 6/2006 | Liu et al. | |
| 2006/0159611 A1 | 7/2006 | Hummelen et al. | |
| 2006/0185714 A1* | 8/2006 | Nam et al. | 136/244 |
| 2006/0201390 A1 | 9/2006 | Lahann et al. | |
| 2006/0211272 A1 | 9/2006 | Lee et al. | |
| 2006/0216610 A1 | 9/2006 | Galvin et al. | |
| 2006/0225778 A1 | 10/2006 | Brabec et al. | |
| 2006/0225782 A1 | 10/2006 | Berke et al. | |
| 2006/0243959 A1 | 11/2006 | Sargent et al. | |
| 2006/0249203 A1 | 11/2006 | Li et al. | |
| 2006/0252853 A1 | 11/2006 | Ajayan et al. | |
| 2006/0257657 A1 | 11/2006 | Curran et al. | |
| 2006/0261733 A1 | 11/2006 | Suzuki et al. | |
| 2006/0266982 A1 | 11/2006 | Su et al. | |
| 2006/0272701 A1 | 12/2006 | Ajayan et al. | |
| 2006/0293426 A1 | 12/2006 | Curran et al. | |
| 2007/0012349 A1 | 1/2007 | Gaudiana et al. | |
| 2007/0014939 A1 | 1/2007 | Gaudiana et al. | |
| 2007/0037302 A1 | 2/2007 | Gaudiana et al. | |
| 2007/0051941 A1 | 3/2007 | Duerr et al. | |
| 2007/0082140 A1 | 4/2007 | Suzuki et al. | |
| 2007/0089779 A1 | 4/2007 | Balasubramanian et al. | |
| 2007/0096085 A1 | 5/2007 | Rand et al. | |
| 2007/0102694 A1 | 5/2007 | Drndic et al. | |
| 2007/0108539 A1 | 5/2007 | Brabec et al. | |
| 2007/0112133 A1 | 5/2007 | Lee et al. | |
| 2007/0115399 A1 | 5/2007 | Brabec et al. | |
| 2007/0138483 A1 | 6/2007 | Lee et al. | |
| 2007/0176174 A1 | 8/2007 | Lee et al. | |
| 2007/0224464 A1 | 9/2007 | Balasubramanian et al. | |
| 2007/0275498 A1 | 11/2007 | Beecher et al. | |
| 2007/0278481 A1 | 12/2007 | Lee et al. | |
| 2007/0289626 A1 | 12/2007 | Brabee et al. | |
| 2007/0290197 A1 | 12/2007 | Firon et al. | |
| 2008/0006322 A1 | 1/2008 | Wang et al. | |
| 2008/0020208 A1 | 1/2008 | Lee et al. | |
| 2008/0041447 A1 | 2/2008 | Tseng et al. | |
| 2008/0066802 A1 | 3/2008 | Reddy | |
| 2008/0110494 A1 | 5/2008 | Reddy | |
| 2008/0230120 A1 | 9/2008 | Reddy | |
| 2008/0308148 A1 | 12/2008 | Leidholm et al. | |
| 2009/0050207 A1 | 2/2009 | Galvin et al. | |
| 2009/0084436 A1 | 4/2009 | Yang et al. | |
| 2009/0120491 A1 | 5/2009 | Berson et al. | |
| 2009/0126796 A1 | 5/2009 | Yang et al. | |
| 2009/0173372 A1 | 7/2009 | Carroll et al. | |
| 2009/0232867 A1 | 9/2009 | Domb et al. | |
| 2009/0242416 A1 | 10/2009 | Yun et al. | |
| 2009/0301565 A1 | 12/2009 | Curran et al. | |

FOREIGN PATENT DOCUMENTS

| | | |
|---|---|---|
| EP | 1 180 805 A2 | 2/2002 |
| EP | 0 949 199 B1 | 5/2003 |
| GB | 2 430 679 A | 9/2005 |
| JP | 63232467 A | 9/1988 |
| WO | WO-01/55697 A1 | 2/2001 |
| WO | WO-03/065471 A2 | 8/2003 |
| WO | WO-2004/046031 A1 | 3/2004 |
| WO | WO-2004/053464 A1 | 6/2004 |
| WO | WO-2004/053546 A1 | 6/2004 |
| WO | 2005029657 A1 | 3/2005 |
| WO | WO-2005/050757 A2 | 6/2005 |
| WO | WO-2005/050757 A3 | 6/2005 |
| WO | WO-2006/083308 A2 | 8/2006 |
| WO | WO-2006/083308 A3 | 8/2006 |
| WO | WO-2006-098783 A2 | 9/2006 |
| WO | WO-2006/098783 A3 | 9/2006 |
| WO | WO-2007/022221 A2 | 2/2007 |
| WO | WO-2007/029275 A1 | 3/2007 |
| WO | WO-2007/076843 A1 | 7/2007 |
| WO | WO-2007/100600 A2 | 9/2007 |
| WO | WO-2007/100600 A3 | 9/2007 |
| WO | WO-2007/130972 A2 | 11/2007 |
| WO | WO-2008/012079 A1 | 1/2008 |
| WO | WO-2009/012465 A9 | 1/2009 |

OTHER PUBLICATIONS

Hoppe et al. Adv. Funct. Mater. 2004, 14, No. 10, October.*
Tsuzuki et al., Solar Energy Materials and Solar Cells, vol. 61, Issue 1, Feb. 15, 2000, pp. 1-8.*
Kang et al., 3rd World Conference on Photovoltaic Energy Conversion, May 11-18, 2003, Osaka, Japan.*
Frogley et al., Composites Science and Technology, vol. 63, Issue 11, Aug. 2003, pp. 1647-1654.*
Tammela et al., Optical Fiber Communication Conference, vol. 2, Feb. 23-27, 2004.*
Kim et al., Journal of Applied Physics, vol. 86, No. 11, Dec. 1, 1999, p. 6451-6461.*
Hass et al., Journal of the Optical Society of America, vol. 51, No. 7 Jul. 1961 p. 719-722.*
International Search Report and Written Opinion of the International Searching Authority, PCT/US2008/082262, international filing date Mar. 11, 2008, 10 pages.
International Search Report and Written Opinion of the International Searching Authority, PCT/US2007/017544, international filing date Jul. 8, 2007, 15 pages.
Supplementary European Search Report, dated Sep. 15, 2009, Application No. EP 07 76 1674, 2 pages.

(56) References Cited

OTHER PUBLICATIONS

International Search Report and Written Opinion of the International Searching Authority, PCT/US07/67925, international filing date May 1, 2007, 9 pages.

International Search Report and Written Opinion of the International Searching Authority PCT/US2006/016730, international filing date May 1, 2006, 10 pages.

Peter Peumans, Soichi Uchida and Stephen R. Forrest, *Efficient Bulk Heterojunction Photovoltaic Cells Using Small-Molecular-Weight Organic Thin Films*, Letters to Nature, vol. 425, Sep. 11, 2003, pp. 158-162.

C. Strumpel, M.McCann, C. del Canizo, I. Tobias and P. Fath, *Erbium-Doped Up-Converters on Silicon Solar Cells: Assessment of the Potential*, 4 pages.

Sean E. Shaheen, Chrostph J. Brabec and N. Serdar Sariciftci, *2.5% Efficient Organic Plastic Solar Cells*, Applied Physics Letters, vol. 78, No. 6, Feb. 5, 2001, pp. 841-843.

Marisol Reyes-Reyes, et al., *Meso-Structure Formation for Enhanced Organic Photovoltaic Cells*, Organic Letters, 2005, vol. 7, No. 26, pp. 5749-5752.

Wei Chen, Alan G. Joly, Jan-Olle Malm and Jan-Olov Bovin, *Upconversion Luminescence of $Eu^{3+}$ and $Mn^{2+}$ in $ZnS:Mn^{2+}$, $Eu^{3+}$ Codoped Nanoparticles*, Journal of Applied Physics, vol. 95, No. 2, Jan. 15, 2004, pp. 667-672.

L A Diaz-Torres et al., *Concentration Enhanced Red Upconversion in Nanocrystalline $ZrO_2$: Er under IR Excitation*, Journal of Physics D: Applied Physics, Sep. 1, 2004, 2 pages.

M. Cadek, J.N. Coleman and V. Barron, *Morphological and Mechanical Properties of Carbon-Nanotube-Reinforced Semicrystalline and Amorphous Polymer Composites*, Applied Physics Letters, vol. 81, No. 27, Dec. 30, 2002, pp. 5123-5125.

M. Cadek, et al., *Reinforcement of Polymers with Carbon Nanotubes: The Role of Nanotube Surface Area*, Nano Letters, 2004 vol. 4., No. 2 pp. 353-356.

M. J. Biercuk, et al., *Carbon Nanotube Composites for Thermal Management*, Applied Physics Letters, vol. 80, No. 15, Apr. 15, 2002, pp. 2767-2769.

Rowan Blake, et al., *a Generic Organometallic Approach Toward Ultra-Strong Carbon Nanotube Polymer Composites*, J. Am. Chem. Soc. 2004, vol. 126, No. 33, pp. 10226-10227.

P. Peumans and S.R. Forrest, *Very-high-efficiency Double-heterostructure Copper Phthalocyanine/$C_{60}$ Photovoltaic Cells*, Applied Physics Letters, vol. 79, No. 1., Jul. 2, 2001, pp. 126-128.

A. Yakomov and S. R. Forrest, *High Photovoltage Multiple-heterojunction Organic Solar Cells Incorporating Interfacial Metallic Nanoclusters*, Applied Physics Letters, vol. 80, No. 9, Mar. 4, 2002, pp. 1667-1669.

C.N.R. Rao, et al, *Nanotubes*, Chemphyschem 2001, 2, pp. 78-105.

Henk W. Ch. Postma, et al., *Carbon Nanotube Single-Electron Transistors at Room Temperature*, Science, vol. 293, Jul. 6, 2001, pp. 76-79.

P.M. Ajayan, *Nanotubes from Carbon*, Chem. Rev. 99, (1990) pp. 1787-1799.

J. Bernhole, et al., *Mechanical and Electrical Properties of Nanotubes*, Annu. Rev. Mater. Res. 32, (2002), pp. 347-375.

L. Dai and A.W.H. Mau, *Controlled Synthesis and Modificaton of Carbon Nanotubes and $C_{60}$: Carbon Nanostructures for Advanced Polymeric Composite Materials*, Adv. Mater, 13, (2001) pp. 899-913.

D. Qian and E.C. Dickey, *Load Transfer and Deformation Mechanisms in Carbon Nanotube-Polystyrene Composites*, Appl. Phys. Lett. vol. 76, May 2000, pp. 2868-2870.

S.J. Tans, et al., *Room-temperature transistor based on a single carbon nanotube*, Letters to Nature, vol. 393, pp. 49-52.

M.S. Dresselhaus, et al., Carbon Nanotubes: Synthesis, Structure, Properties, and Applications, Springer-Verlag, Berlin, 2001, 8 pages.

Seamus Curran, David Gutin, and James Dewald, *The cascade solar cell*, SPIE Newsroom, 2 pages.

Wang et al, Luminescence spectroscopy and visible upconversion properties of Er3+ in ZnP nanocrystals, J. Phys. Chem. B, 2004, vol. 108, pp. 18408-18413.

Coakley et al, Conjugated Polymer Photovoltaic Cells, Chem. Mater. 2004, vol. 16, pp. 4533-4542.

Ferrere et al, New perylenes for dye sensitization of TiO2, New J. Chem., 2002, vol. 26, pp. 1155-1160.

\* cited by examiner

ORGANIC OPTOELECTRONIC DEVICES AND APPLICATIONS THEREOF

FIELD OF THE INVENTION

The present invention relates to organic optoelectronic devices and, in particular, to organic photovoltaic devices.

BACKGROUND OF THE INVENTION

Optoelectronic devices using organic materials are becoming increasingly desirable in a wide variety of applications for a number of reasons. Materials used to construct organic optoelectronic devices are relatively inexpensive in comparison to their inorganic counterparts thereby providing cost advantages over optoelectronic devices produced with inorganic materials. Moreover, organic materials provide desirable physical properties, such as flexibility, permitting their use in applications unsuitable for rigid materials. Examples of organic optoelectronic devices comprise organic photovoltaic cells, organic light emitting devices (OLEDs), and organic photodetectors.

Photovoltaic devices convert electromagnetic radiation into electricity by producing a photo-generated current when connected across a load and exposed to light. The electrical power generated by photovoltaic cells can be used in many applications including lighting, heating, battery charging, and powering devices requiring electrical energy.

When irradiated under an infinite load, a photovoltaic device produces its maximum possible voltage, the open circuit voltage or $V_{oc}$. When irradiated with its electrical contacts shorted, a photovoltaic device produces its maximum current, I short circuit or $I_{sc}$. Under operating conditions, a photovoltaic device is connected to a finite load, and the electrical power output is equal to the product of the current and voltage. The maximum power generated by a photovoltaic device cannot exceed the product of $V_{oc}$ and $I_{sc}$. When the load value is optimized for maximum power generation, the current and voltage have the values $I_{max}$ and $V_{max}$ respectively.

A key characteristic in evaluating a photovoltaic cell's performance is the fill factor, ff. The fill factor is the ratio of the photovoltaic cell's actual power to its power if both current and voltage were at their maxima. The fill factor of a photovoltaic cell is provided according to equation (1).

$$ff=(I_{max}V_{max})/(I_{sc}V_{oc}) \quad (1)$$

The fill factor of a photovoltaic is always less than 1, as $I_{sc}$ and $V_{oc}$ are never obtained simultaneously under operating conditions. Nevertheless, as the fill factor approaches a value of 1, a device demonstrates less internal resistance and, therefore, delivers a greater percentage of electrical power to the load under optimal conditions.

Photovoltaic devices may additionally be characterized by their efficiency of converting electromagnetic energy into electrical energy. The conversion efficiency, $\eta_p$, of a photovoltaic device is provided according to equation (2) where $P_{inc}$ is the power of the light incident on the photovoltaic.

$$\eta_p=ff*(I_{sc}V_{oc})/P_{inc} \quad (2)$$

Devices utilizing crystalline or amorphous silicon dominate commercial applications, and some have achieved efficiencies of 23% or greater. However, efficient crystalline-based devices, especially of large surface area, are difficult and expensive to produce due to the problems in fabricating large crystals free from crystalline defects that promote exciton recombination. Commercially available amorphous silicon photovoltaic cells demonstrate efficiencies ranging from about 4 to 12%.

Constructing organic photovoltaic devices having efficiencies comparable to inorganic devices poses a technical challenge. Some organic photovoltaic devices demonstrate efficiencies on the order of 1% or less. The low efficiencies displayed in organic photovoltaic devices results from a severe length scale mismatch between exciton diffusion length ($L_D$) and organic layer thickness. In order to have efficient absorption of visible electromagnetic radiation, an organic film must have a thickness of about 500 nm. This thickness greatly exceeds exciton diffusion length which is typically about 50 nm, often resulting in exciton recombination.

It would be desirable to provide organic photovoltaic devices which display increased efficiencies in converting electromagnetic energy into electrical energy. In view of the advantages of organic optoelectronic devices discussed herein, it would be desirable to provide organic, photovoltaic devices that provide efficiencies comparable to and, in some cases, greater than inorganic photovoltaic devices.

SUMMARY

The present invention provides organic optoelectronic devices, including organic photovoltaic devices, having a fiber structure and methods of making the same.

In an embodiment, the present invention provides an optoelectronic device comprising a fiber core, a radiation transmissive first electrode surrounding the fiber core, at least one photosensitive organic layer surrounding the first electrode and electrically connected to the first electrode, and a second electrode surrounding the organic layer and electrically connected to the organic layer. In some embodiments, the optoelectronic device comprises a photovoltaic cell.

In another embodiment, the present invention provides an optoelectronic device comprising at least one pixel comprising at least one photovoltaic cell, the photovoltaic cell comprising a fiber core, a radiation transmissive first electrode surrounding the fiber core, at least one photosensitive organic layer surrounding the first electrode and electrically connected to the first electrode, and a second electrode surrounding the organic layer and electrically connected to the organic layer. In some embodiments, a pixel comprises a plurality of photovoltaic cells. In other embodiments, an optoelectronic device comprises an array of pixels. In a further embodiment, an optoelectronic device comprises an array of pixels, each pixel comprising a plurality of photovoltaic cells.

A method for producing an optoelectronic device, according to an embodiment of the present invention, comprises providing a fiber core, disposing a radiation transmissive first electrode on a surface of the core, disposing at least one photosensitive organic layer in electrical communication with the first electrode, and disposing a second electrode in electrical communication with the organic layer. In some embodiments, the optoelectronic device comprises a photovoltaic cell.

The present invention additionally provides methods for converting electromagnetic energy into electrical energy. In an embodiment, a method of the present invention utilizes wave-guiding to increase the efficiency of conversion. Embodiments of optoelectronic devices of the present invention described herein may utilize wave-guiding to increase their efficiency.

In one embodiment, a method for converting electromagnetic energy into electrical energy comprises receiving radiation along the longitudinal axis of an optical fiber, transmitting the radiation into at least one photosensitive organic layer through a radiation transmissive electrode surrounding the optical fiber, generating excitons in the organic layer, and separating the excitons into electrons and holes. A method for converting electromagnetic energy into electrical energy, in some embodiments, further comprises removing the electrons into an external circuit.

In another embodiment, a method for converting electromagnetic energy into electrical energy comprises receiving radiation along the longitudinal axis of an optical fiber at an incident angle sufficient to produce total internal reflection at an interface of a photosensitive organic layer and an adjacent layer disposed on a surface of the optical fiber.

These and other embodiments are of the present invention are described in greater detail in the detailed description of the invention which follows.

DETAILED DESCRIPTION

Figure 1:
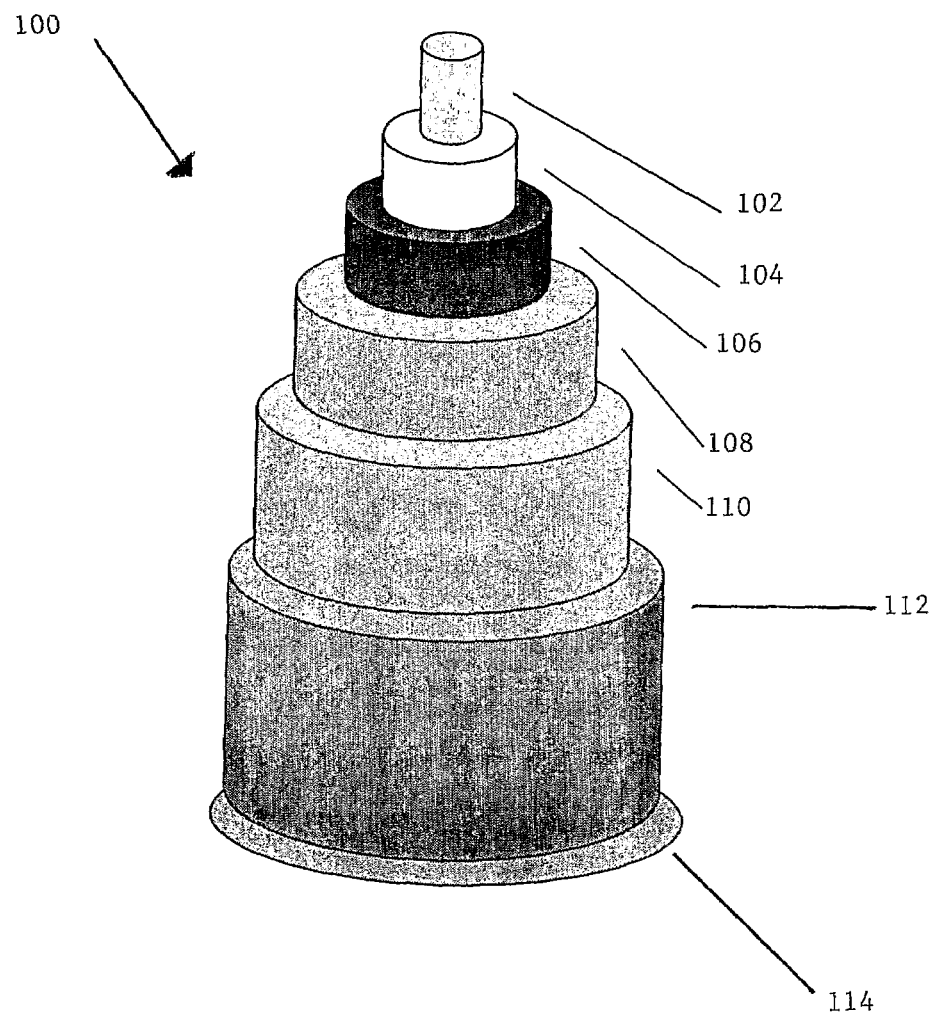
FIG. 1 illustrates cut away view of an optoelectronic device comprising a fiber structure according to an embodiment of the present invention.

The present invention provides organic optoelectronic devices, including organic photovoltaic devices, having a fiber structure. In one embodiment, the present invention provides an organic optoelectronic device comprising a fiber core, a radiation transmissive first electrode surrounding the fiber core, at least one photosensitive organic layer surrounding the first electrode and electrically connected to the first electrode, and a second electrode surrounding the organic layer and electrically connected to the organic layer. In some embodiments, the organic optoelectronic device comprises a photovoltaic cell.

Turning now to components that can be included in various embodiments of optoelectronic devices of the present invention, optoelectronic devices of the present invention comprise a fiber core. The fiber core, according to embodiments of the present invention, comprises an optical fiber. Optical fibers suitable for use in the present invention can comprise glass optical fibers, quartz optical fibers, and plastic optical fibers (POF). Plastic optical fibers, in some embodiments, can be constructed of polymethyl methacrylate. In other embodiments, plastic optical fibers can be constructed of perfluorocyclobutane (PFBC) containing polymers, such as perfluorocyclobutane poly(arylether)s. Optical fibers, according to some embodiments of the present invention, can comprise single mode optical fibers and multi-mode optical fibers. Optical fibers for use in the present invention can be flexible.

In some embodiments, a fiber core of an optoelectronic device of the present invention can have a diameter ranging from about 1 µm to about 2 mm. In other embodiments, a fiber core can have a diameter ranging from about 90 µm to about 1 mm. In a further embodiment, a fiber core can have a diameter ranging from about 20 µm to about 800 µm.

A fiber core, according to some embodiments, can have a length ranging from about 500 nm to about 100 mm. In other embodiments, a fiber core can have a length ranging from about 1 µm to about 1 mm. In a further embodiment, a fiber core can have a length ranging from about 10 µm to about 100 µm.

Fiber cores, according to some embodiments of the present invention, can further comprise one or more upconverters. As understood by one of skill in the art, an upconverter is a material operable to emit electromagnetic radiation having energy greater than that of the electromagnetic radiation absorbed by the material to create the excited state. Upconverters suitable for use in the present invention, in some embodiments, can absorb infrared radiation and emit visible radiation at wavelengths operable to be absorbed by photosensitive organic layers of optoelectronic devices of the present invention.

Upconverters, in some embodiments, can include materials comprising at least one Lanthanide series element. In some embodiments, upconverter materials can comprise nanoparticles comprising at least one Lanthanide series element. Lanthanide series elements suitable for use in upconverter materials according to some embodiments of the present invention comprise erbium, ytterbium, dysprosium, holmium, or mixtures thereof. In some embodiments, upconverter materials comprise metal oxides and metal sulfides doped with ions of erbium, ytterbium, dysprosium, holmium, or mixtures thereof. In other embodiments, optical fibers may be doped directly with ions of erbium, ytterbium, dysprosium, holmium, or mixtures thereof.

In other embodiments, upconverter materials can comprise organic chemical species. Organic upconverter materials can comprise $H_2C_6N$ and 4-dialkylamino-1,8-naphthalimides as well as 1,8-naphthalimide derivatives and compounds, such as multibranched naphthalimide derivatives TPA-NA1, TPA-NA2, and TPA-NA3. Organic upconverter materials can also comprise 4-(dimethylamino)cinnamonitrile (cis and trans), trans-4-[4-(dimethylamino)styryl]-1-methylpyridinium iodide, 4-[4-(dimethylamino)styryl]pyridine, 4-(diethylamino)benzaldehyde diphenylhydrazone, trans-4-[4-(dimethylamino)styryl]-1-methylpyridinium p-toluenesulfonate, 2-[ethyl[4-[2-(4-nitrophenyl)ethenyl]phenyl]amino]ethanol, 4-dimethylamino-4'-nitrostilbene, Disperse Orange 25, Disperse Orange 3, and Disperse Red 1.

In a further embodiment, upconverter materials can comprise quantum dots. Quantum dots, according to some embodiments, can comprise III/V and II/VI semiconductor materials, such as cadmium selenide (CdSe), cadmium telluride (CdTe), and zinc selenide (ZnSe). Upconverter materials can also comprise core-shell architectures of quantum dots.

In addition to those provided herein, embodiments of the present invention contemplate additional upconverter materials comprising transition metals, such as chromium.

Upconverters, in some embodiments, can be disposed within the optical fiber core. In other embodiments, upconverters can be disposed on a surface of the optical fiber core and at the interface of the fiber core with a radiation transmissive first electrode.

Fiber cores, in some embodiments, can further comprise at least one scattering agent. In another embodiment, a fiber core can comprise a plurality of scattering agents. Scattering agents, according to embodiments of the present invention, can scatter electromagnetic radiation propagating along the longitudinal axis of the fiber core. In some embodiments, scattering agents can scatter the electromagnetic radiation radially outward from the fiber core permitting absorption of the scattered radiation by one or more photosensitive organic layers surrounding the fiber core.

Scattering agents, in some embodiments, can comprise transition metal nanoparticles. Transition metals suitable for use as scattering agents, in an embodiment, can comprise gold, silver, copper, niobium, palladium, and platinum. Transition metal nanoparticles, according to some embodiments, can comprise rods or wires. In one embodiment, for example, a transition metal nanorod or nanowire can have a diameter ranging from about 2 nm to about 50 nm.

Optoelectronic devices of the present invention comprise a radiation transmissive first electrode surrounding the fiber core. Radiation transmissive, as used herein, refers to the ability to at least partially pass radiation in the visible region of the electromagnetic spectrum. In some embodiments, radiation transmissive materials can pass visible electromagnetic radiation with minimal absorbance or other interference. Moreover, electrodes, as used herein, refer to layers that provide a medium for delivering photo-generated current to an external circuit or providing bias voltage to the optoelectronic device. An electrode provides the interface between the photoactive regions of an organic optoelectronic device and a wire, lead, trace, or other means for transporting the charge carriers to or from the external circuit.

A radiation transmissive first electrode, according to some embodiments of the present invention, comprises a radiation transmissive conducting oxide. Radiation transmissive conducting oxides, in some embodiments, can comprise indium tin oxide (ITO), gallium indium tin oxide (GITO), and zinc indium tin oxide (ZITO). In another embodiment, the radiation transmissive first electrode can comprise a radiation transmissive polymeric material such as polyanaline (PANI) and its chemical relatives. In some embodiments, 3,4-polyethylenedioxythiophene (PEDOT) can be a suitable radiation transmissive polymeric material for the first electrode. In other embodiments, a radiation transmissive first electrode can comprise a carbon nanotube layer having a thickness operable to at least partially pass visible electromagnetic radiation.

In another embodiment, a radiation transmissive first electrode can comprise a composite material comprising a nanoparticle phase dispersed in a polymeric phase. The nanoparticle phase, in one embodiment, can comprise carbon nanotubes, fullerenes, or mixtures thereof. In a further embodiment, a radiation transmissive first electrode can comprise a metal layer having a thickness operable to at least partially pass visible electromagnetic radiation. In some embodiments, a metal layer can comprise elementally pure metals or alloys. Metals suitable for use as a radiation transmissive first electrode can comprise high work function metals.

In some embodiments, a radiation transmissive first electrode can have a thickness ranging from about 10 nm to about 1 μm. In other embodiments, a radiation transmissive first electrode can have a thickness ranging from about 100 nm to about 900 nm. In another embodiment, a radiation transmissive first electrode can have a thickness ranging from about 200 nm to about 800 nm. In a further embodiment, a radiation transmissive first electrode can have a thickness greater than 1 μm.

Optoelectronic devices of the present invention comprise at least one photosensitive organic layer. Optoelectronic devices, according to some embodiments, can comprise a plurality of photosensitive organic layers.

In some embodiments, a photosensitive organic layer has a thickness ranging from about 30 nm to about 1 μm. In other embodiments, a photosensitive organic layer has a thickness ranging from about 80 nm to about 800 nm. In a further embodiment, a photosensitive organic layer has a thickness ranging from about 100 nm to about 300 nm.

A photosensitive organic layer, according to embodiments of the present invention, comprises at least one photoactive region in which electromagnetic radiation is absorbed to produce excitons which may subsequently dissociate into electrons and holes. In some embodiments, a photoactive region can comprise a polymer. Polymers suitable for use in a photoactive region of a photosensitive organic layer, in one embodiment, can comprise conjugated polymers such as thiophenes including poly(3-hexylthiophene) (P3HT), poly(3-octylthiophene) (P3OT), and polythiophene (PTh).

In some embodiments, polymers suitable for use in a photoactive region of a photosensitive organic layer can comprise semiconducting polymers. In one embodiment, semiconducting polymers include phenylene vinylenes, such as poly(phenylene vinylene) and poly(p-phenylene vinylene) (PPV), and derivatives thereof. In other embodiments, semiconducting polymers can comprise poly fluorenes, naphthalenes, and derivatives thereof. In a further embodiment, semiconducting polymers for use in a photoactive region of a photosensitive organic layer can comprise poly(2-vinylpyridine) (P2VP), polyamides, poly(N-vinylcarbazole) (PVCZ), polypyrrole (PPy), and polyaniline (PAn).

A photoactive region, according to some embodiments, can comprise small molecules. In one embodiment, small molecules suitable for use in a photoactive region of a photosensitive organic layer can comprise coumarin 6, coumarin 30, coumarin 102, coumarin 110, coumarin 153, and coumarin 480 D. In another embodiment, a small molecule can comprise merocyanine 540. In a further embodiment, small molecules can comprise 9,10-dihydrobenzo[a]pyrene-7 (8H)-one, 7-methylbenzo[a]pyrene, pyrene, benzo[e]pyrene, 3,4-dihydroxy-3-cyclobutene-1,2-dione, and 1,3-bis[4-(dimethylamino)phenyl-2,4-dihydroxycyclobutenediylium dihydroxide.

In some embodiments of the present invention, exciton dissociation is precipitated at heterojunctions in the organic layer formed between adjacent donor and acceptor materials. Organic layers, in some embodiments of the present invention, comprise at least one bulk heterojunction formed between donor and acceptor materials. In other embodiments, organic layers comprise a plurality of bulk heterojunctions formed between donor and acceptor materials.

In the context of organic materials, the terms donor and acceptor refer to the relative positions of the highest occupied molecular orbital (HOMO) and lowest unoccupied molecular orbital (LUMO) energy levels of two contacting but different organic materials. This is in contrast to the use of these terms in the inorganic context, where donor and acceptor may refer to types of dopants that may be used to create inorganic n- and p-type layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

A photoactive region in a photosensitive organic layer, according to some embodiments of the present invention, comprises a polymeric composite material. The polymeric composite material, in an embodiment, can comprise a nanoparticle phase dispersed in a polymeric phase. Polymers suitable for producing the polymeric phase of a photoactive region can comprise conjugated polymers such as thiophenes including poly(3-hexylthiophene) (P3HT) and poly(3-octylthiophene) (P3OT).

In some embodiments, the nanoparticle phase dispersed in the polymeric phase of a polymeric composite material comprises at least one carbon nanoparticle. Carbon nanoparticles can comprise fullerenes, carbon nanotubes, or mixtures thereof. Fullerenes suitable for use in the nanoparticle phase, in one embodiment, can comprise 1-(3-methoxycarbonyl) propyl-1-phenyl(6,6)$C_{61}$ (PCBM). Carbon nanotubes for use in the nanoparticle phase, according to some embodiments, can comprise single-walled nanotubes, multi-walled nanotubes, or mixtures thereof.

In some embodiments of the present invention, the polymer to nanoparticle ratio in polymeric composite materials ranges from about 1:4 to about 1:0.4. In other embodiments, the polymer to nanoparticle ratio in polymeric composite materials ranges from about 1:2 to about 1:0.6. In one embodiment, for example, the ratio of poly(3-hexylthiophene) to PCBM ranges from about 1:1 to about 1:0.4.

In a further embodiment, the nanoparticle phase dispersed in the polymeric phase comprises at least one nanowhisker. A nanowhisker, as used herein, refers to a crystalline carbon nanoparticle formed from a plurality of carbon nanoparticles. Nanowhiskers, in some embodiments, can be produced by annealing a photosensitive organic layer comprising the polymeric composite material. Carbon nanoparticles operable to form nanowhiskers, according to some embodiments, can comprise single-walled carbon nanotubes, multi-walled carbon nanotubes, and fullerenes. In one embodiment, nanowhiskers comprise crystalline PCBM. Annealing the photosensitive organic layer, in some embodiments, can further increase the dispersion of the nanoparticle phase in the polymeric phase.

In embodiments of photoactive regions comprising a polymeric phase and a nanoparticle phase, the polymeric phase serves as a donor material and the nanoparticle phase serves as the acceptor material thereby forming a heterojunction for the separation of excitons into holes and electrons. In embodiments wherein nanoparticles are dispersed throughout the polymeric phase, the photoactive region of the organic layer comprises a plurality of bulk heterojunctions.

In further embodiments, donor materials in a photoactive region of a photosensitive organic layer can comprise organometallic compounds including porphyrins, phthalocyanines, and derivatives thereof. Through the use of an organometallic material in the photoactive region, photosensitive devices incorporating such materials may efficiently utilize triplet excitons. It is believed that the singlet-triplet mixing may be so strong for organometallic compounds that the absorptions involve excitation from the singlet ground states directly to the triplet excited states, eliminating the losses associated with conversion from the singlet excited state to the triplet excited state. The longer lifetime and diffusion length of triplet excitons in comparison to singlet excitons may allow for the use of a thicker photoactive region, as the triplet excitons may diffuse a greater distance to reach the donor-acceptor heterojunction, without sacrificing device efficiency.

In further embodiments, acceptor materials in a photoactive region of a photosensitive organic layer can comprise perylenes, naphthalenes, and mixtures thereof.

Optoelectronic devices of the present invention comprise a second electrode surrounding the organic layer. In some embodiments, the second electrode can comprise a metal. As used herein, metal refers to both materials composed of an elementally pure metal, e.g., gold, and also metal alloys comprising materials composed of two or more elementally pure materials. In some embodiments, the second electrode comprises gold, silver, aluminum, or copper. The second electrode, according to some embodiments, can have a thickness ranging from about 10 nm to about 10 μl. In other embodiments, the second electrode can have a thickness ranging from about 100 nm to about 1 μm. In a further embodiment, the second electrode can have a thickness ranging from about 200 nm to about 800 nm.

A layer comprising lithium fluoride (LiF), according to some embodiments, can be disposed between a photosensitive organic layer and second electrode. The LiF layer can have a thickness ranging from about 5 angstroms to about 10 angstroms.

Optoelectronic devices of the present invention, in some embodiments, can further comprise additional layers such as one or more exciton blocking layers. In embodiments of the present invention, an exciton blocking layer (EBL) can act to confine photogenerated excitons to the region near the dissociating interface and prevent parasitic exciton quenching at a photosensitive organic/electrode interface. In addition to limiting the path over which excitons may diffuse, an EBL can additionally act as a diffusion barrier to substances introduced during deposition of the electrodes. In some embodiments, an EBL can have a sufficient thickness to fill pin holes or shorting defects which could otherwise render an organic photovoltaic device inoperable.

An EBL, according to some embodiments of the present invention, can comprise a polymeric composite material. In one embodiment, an EBL comprises carbon nanoparticles dispersed in 3,4-polyethylenedioxythiophene:polystyrenesulfonate (PEDOT:PSS). In another embodiment, an EBL comprises carbon nanoparticles dispersed in poly(vinylidene chloride) and copolymers thereof. Carbon nanoparticles dispersed in the polymeric phases including PEDOT:PSS and poly(vinylidene chloride) can comprise single-walled nanotubes, multi-walled nanotubes, fullerenes, or mixtures thereof. In further embodiments, EBLs can comprise any polymer having a work function energy operable to permit the transport of holes while impeding the passage of electrons.

In some embodiments, an EBL may be disposed between the radiation transmissive first electrode and a photosensitive organic layer of an optoelectronic device. In some embodiments wherein the optoelectronic device comprises a plurality of photosensitive organic layers, EBLs can be disposed between the photosensitive organic layers.

Optoelectronic devices of the present invention, in some embodiments, can further comprise a protective layer surrounding the second electrode. The protective layer can provide optoelectronic devices provided herein with increased durability thereby permitting their use in a wide variety of applications including photovoltaic applications. In some embodiments, the protective layer comprises a polymeric composite material. In one embodiment, the protective layer comprises nanoparticles dispersed in poly(vinylidene chloride). Nanoparticles dispersed in poly(vinylidene chloride), according to some embodiments, can comprise single-walled carbon nanotubes, multi-walled carbon nanotubes, fullerenes, or mixtures thereof.

Optoelectronic devices of the present invention, in some embodiments, can further comprise an external metallic contact. In one embodiment, the external metallic contact surrounds the second electrode and is in electrical communication with the second electrode. The external metallic contact, in some embodiments, can be operable to extract current over at least a portion of the circumference and length of the fiber optoelectronic device. In other embodiments, the external metal contact can be operable to extract current over the entire length and circumference of the fiber optoelectronic device. External metallic contacts, in some embodiments, can comprise metals including gold, silver, or copper. In a further embodiment, external metal contacts can be operable to reflect non-absorbed electromagnetic radiation back into at least one photosensitive organic layer for further absorption.

Optoelectronic devices, according to some embodiments of the present invention, can further comprise charge transfer layers. Charge transfer layers, as used herein, refer to layers which only deliver charge carriers from one section of an optoelectronic device to another section. In one embodiment, for example, a charge transfer layer can comprise an exciton blocking layer.

A charge transfer layer, in some embodiments, can be disposed between a photosensitive organic layer and radiation transmissive first electrode and/or a photosensitive organic layer and second electrode. In other embodiments, charge transfer layers may be disposed between the second electrode and protective layer of an optoelectronic device. Charge transfer layers, according to some embodiments, are not photoactive.

FIG. 1 illustrates cut-away view of an optoelectronic device having a fiber structure according to one embodiment of the present invention. The optoelectronic device (100) shown in FIG. 1 comprises an optical fiber core (102). As discussed herein, the fiber core (102) can comprise a glass optical fiber, a quartz optical fiber, or a plastic optical fiber.

The optical fiber core (102) is longitudinally surrounded by a radiation transmissive first electrode (104). The radiation transmissive first electrode (104) can comprise a radiation transmissive conducting oxide such as indium tin oxide, gallium indium tin oxide, or zinc indium tin oxide. The radiation transmissive first electrode (104) is surrounded by an exciton blocking layer (106). In some embodiments, the EBL (106) can comprise carbon nanoparticles dispersed in a polymeric phase such as 3,4-polyethylenedioxythiophene or poly(vinylidene chloride).

The EBL (106) is surrounded by an photosensitive organic layer (108). The photosensitive organic layer (108), in some embodiments, comprises a P3HT-carbon nanoparticle polymeric composite. The photosensitive organic layer (108), in some embodiments, can be in direct electrical communication with the radiation transmissive first electrode (104). In other embodiments, a charge transfer layer, including an exciton blocking layer, may be disposed between the radiation transmissive first electrode (104) and the photosensitive organic layer (108) to provide indirect electrical communication between the radiation transmissive first electrode (104) and the photosensitive organic layer (108).

The photosensitive organic layer (108) is surrounded by a second electrode (110). The photosensitive organic layer (108), in some embodiments, can be in direct electrical communication with the second electrode (110). In other embodiments, a charge transfer layer, such as an exciton blocking layer, (not shown) may be disposed between the photosensitive organic layer (108) and the second electrode (110) to provide indirect electrical communication between the photosensitive organic layer (108) and the second electrode (110). In some embodiments, the second electrode (110) comprises a metal, such as aluminum, gold, silver, nickel, or copper.

The second electrode (110) is surrounded by a protective layer (112) comprising a polymeric composite material. In some embodiments, the polymeric composite material of the protective layer comprises carbon nanoparticles dispersed in poly(vinylidene chloride) and/or copolymers thereof. The carbon nanoparticles can comprise single-walled carbon nanotubes, multi-walled carbon nanotubes, fullerenes, or mixtures thereof.

The protective layer (112) is surrounded by an external metal contact (114) operable to extract current over a length and circumference of the fiber optoelectronic device. In some embodiments, an external metallic (114) contact can comprise metals including gold, silver, or copper.

Figure 2:
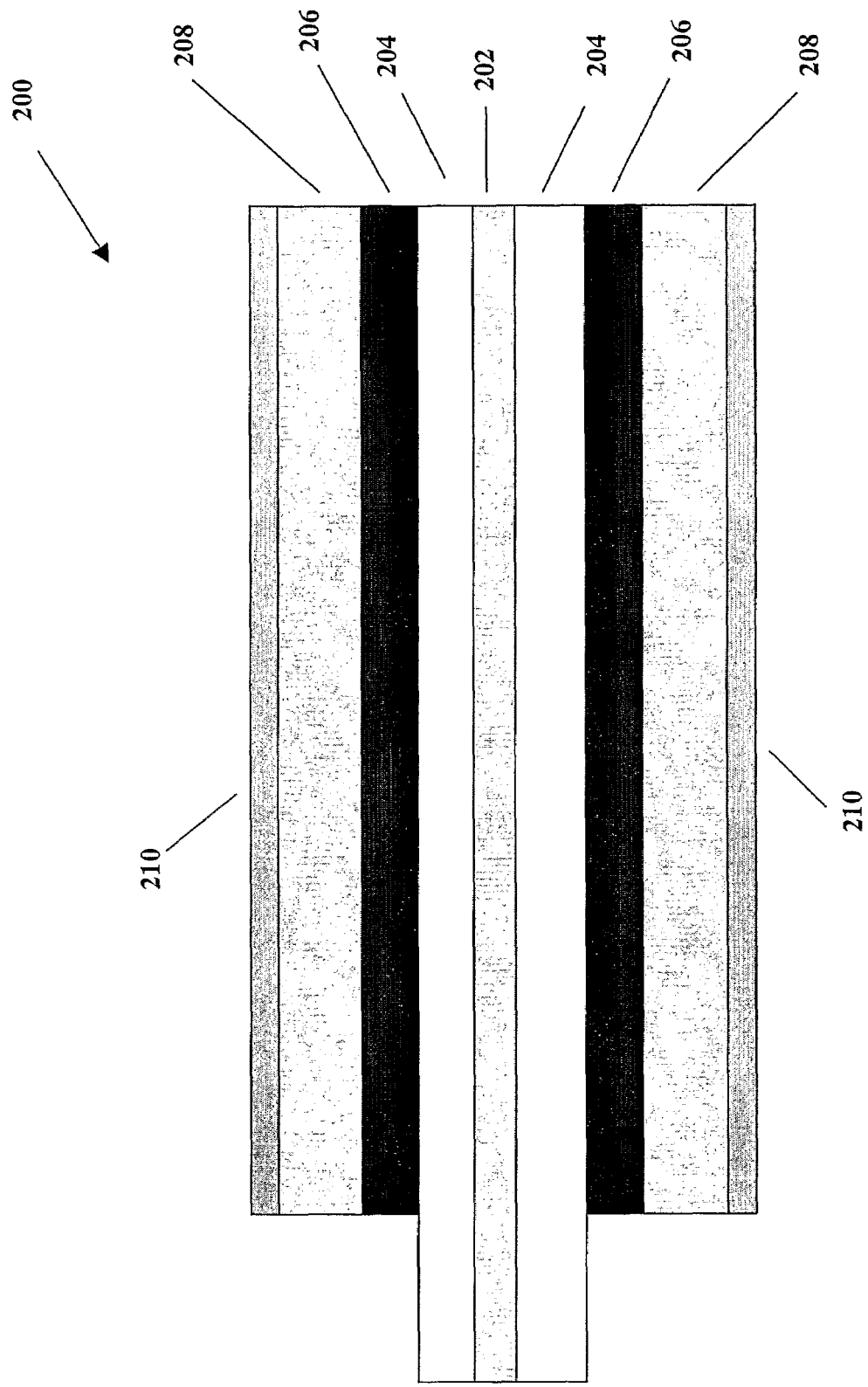
FIG. 2 illustrates an cross sectional view of an optoelectronic device comprising a fiber structure according to an embodiment of the present invention.

FIG. 2 illustrates a cross-sectional view of an optoelectronic device comprising a fiber structure according to another embodiment of the present invention. The optoelectronic device (200) displayed in FIG. 2 comprises an optical fiber core (202) and a radiation transmissive first electrode (204) surrounding the optical fiber core (202). An exciton blocking layer (206) surrounds the radiation transmissive first electrode (204), and a photosensitive organic layer (208) surrounds the exciton blocking layer (206). A second electrode (210) surrounds the photosensitive organic layer (208). The compositions of the optical fiber core (202) and surrounding layers (204-210) are consistent with those provided in the various embodiments described herein.

In the embodiment shown in FIG. 2, the optical fiber core (202) and radiation transmissive first electrode (204) extend longitudinally beyond the remaining layers of the optoelectronic device (200). The longitudinal extension of the optical fiber core (202) and radiation transmissive first electrode (204), in some embodiments, can facilitate attachment of the optoelectronic device (200) to an external electrical circuit.

Figure 3:
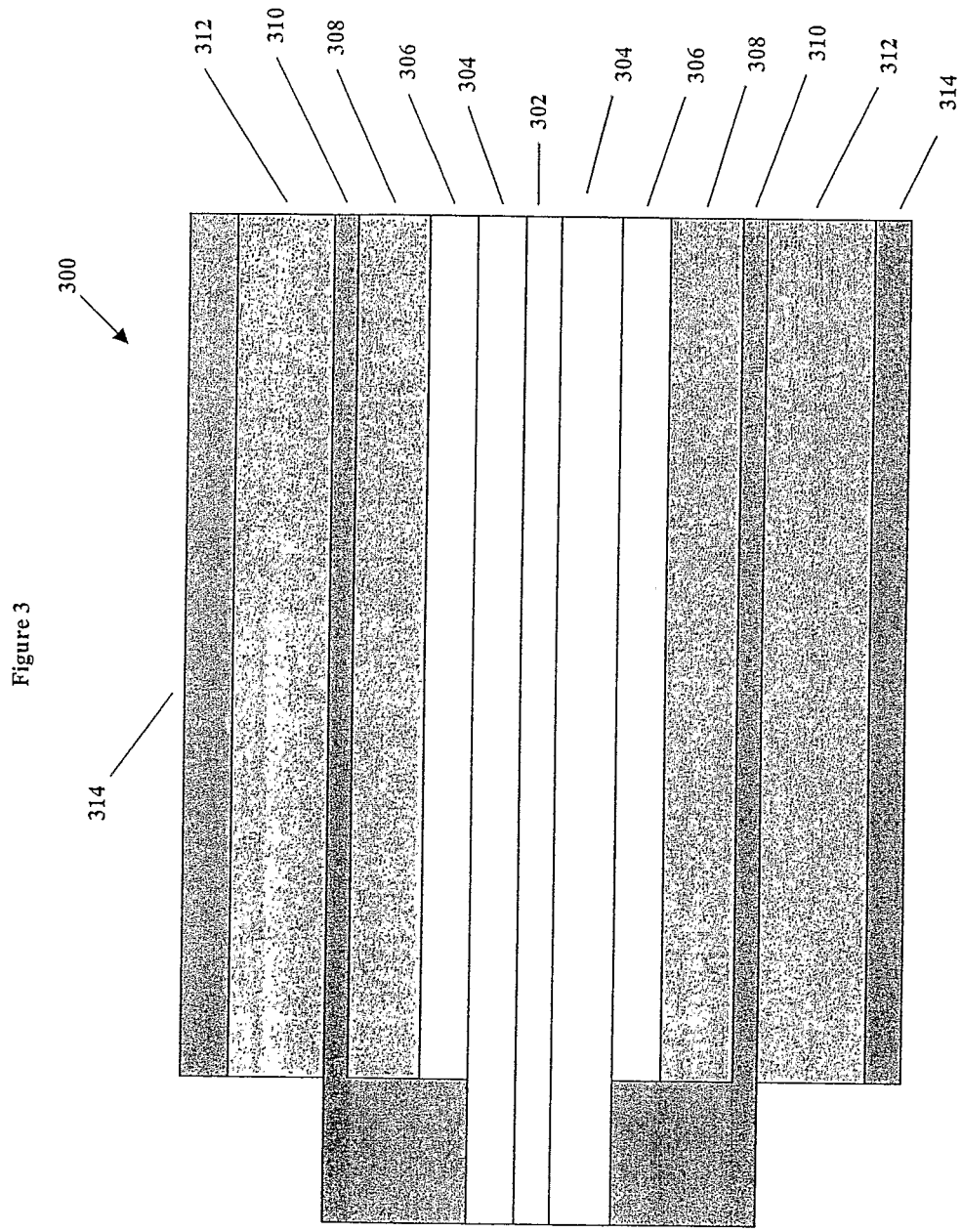
FIG. 3 illustrates an cross sectional view of an optoelectronic device comprising a fiber structure according to an embodiment of the present invention.

FIG. 3 illustrates a cross-sectional view of an optoelectronic device comprising a fiber structure according to another embodiment of the present invention, wherein the optoelectronic device comprises a plurality of photosensitive organic layers. The optoelectronic device (300) comprises an optical fiber core (302). The fiber core (302) can comprise a glass optical fiber, a quartz optical fiber, or a plastic optical fiber.

The optical fiber core (302) is surrounded by a radiation transmissive first electrode (304). The radiation transmissive first electrode (304) can comprise a radiation transmissive conducting oxide such as indium tin oxide, gallium indium tin oxide, or zinc indium tin oxide. The radiation transmissive first electrode is surrounded by a first exciton blocking layer (306). In some embodiments, the first EBL (306) can comprise carbon nanoparticles dispersed in a polymeric phase such as 3,4-polyethylenedioxythiophene or poly(vinylidene chloride).

The first EBL (306) is surrounded by a first photosensitive organic layer (308). The first photosensitive organic layer (308), in some embodiments, can comprise a P3HT-carbon nanoparticle polymeric composite. The first photosensitive organic layer (308) is surrounded by a second exciton blocking layer (310). The second EBL, in some embodiments, can also comprise carbon nanoparticles dispersed in 3,4-polyethylenedioxythiophene or poly(vinylidene chloride).

The second EBL is surrounded by a second photosensitive organic layer (312). The second photosensitive organic layer (312), in some embodiments, can comprise a polymeric material, including a polymeric composite, having an electromagnetic radiation absorption profile that largely overlaps that of the first organic layer (308). In other embodiments, the second photosensitive organic layer (312) can comprise a polymeric material, including a polymeric composite, having an electromagnetic radiation absorption profile that does not overlap or minimally overlaps that of the first organic layer (308).

The second organic layer (312) is surrounded by a second electrode (314) that can reflect electromagnetic radiation not absorbed by the photosensitive organic layers (308), (312) back into the organic layers for absorption. The second electrode (314), in some embodiments, comprises a metal, such as aluminum, gold, silver, nickel, or copper.

In the embodiment shown in FIG. 3, the optical fiber core (302), radiation transmissive first electrode (304), and second exciton blocking layer (310) extend longitudinally beyond the remaining layers of the optoelectronic device. The longitudinal extension of the optical fiber core (302), radiation transmissive first electrode (304), and second exciton blocking layer (310) can facilitate attachment of the optoelectronic device (300) to an external electrical circuit.

Although FIG. 3 illustrates an optoelectronic device having two photosensitive organic layers, embodiments of the present invention contemplate optoelectronic devices comprising greater than two photosensitive organic layers, including optoelectronic devices having three, four, five, and greater than five photosensitive organic layers. In some embodiments, an optoelectronic device can comprise at least 10 photosensitive organic layers.

A plurality of photosensitive organic layers can be buffered from one another, in some embodiments, by disposing exciton blocking layers between the photosensitive organic layers. By providing a plurality of photosensitive organic layers wherein each layer has a distinct absorption profile, optoelectronic devices of the present invention can increase or maximize exciton generation across the electromagnetic spectrum.

In some embodiments, an optoelectronic device can comprise a fiber core having a plurality of photosensitive regions located along its longitudinal axis, each of the plurality of photosensitive regions comprises a radiation transmissive first electrode surrounding the fiber core, at least one photosensitive organic layer surrounding the first electrode and electrically connected to the first electrode, and a second electrode surrounding the organic layer and electrically connected to the organic layer. Each of the plurality of regions may further comprise additional layers as set forth herein, including additional photosensitive organic and exciton blocking layers as provided in FIG. 3.

Figure 4:
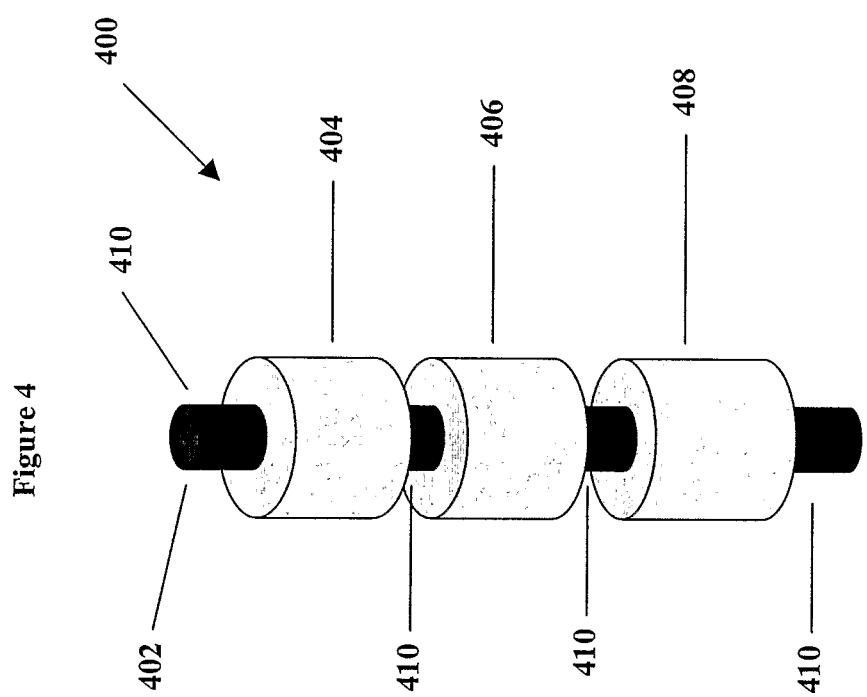
FIG. 4 illustrates an optoelectronic device comprising a fiber structure according to an embodiment of the present invention.

FIG. 4 illustrates an optoelectronic device (400) comprising a fiber core (402) having a plurality of photosensitive regions (404, 406, 408) disposed along its longitudinal axis. In some embodiments, the photosensitive organic layer or layers of each region (404, 406, 408) can be chosen to have a distinct electromagnetic radiation absorption profile that does not overlap or minimally overlaps with the absorption profiles of the other regions. In the present embodiment, for example, the photosensitive organic layer of region 404 can have an absorption profile ranging from about 400 nm to about 600 nm while the photosensitive organic layer of region 406 can have an absorption profile ranging from about 600 nm to about 800 nm. The photosensitive organic layer of region 408 can have an absorption profile ranging from about 800 nm to about 1100 nm.

By providing a plurality of photosensitive regions wherein each region comprises at least one photosensitive organic layer having a distinct absorption profile, optoelectronic devices of the present invention can increase or maximize exciton generation across the electromagnetic spectrum.

In some embodiments, the fiber core of an optoelectronic device comprising a plurality of photosensitive regions can be partially coated with a non-radiation transmissive material that prevents electromagnetic radiation propagating along the longitudinal axis of the fiber from escaping the fiber. Suitable coating materials can comprise metal cladding or any other material that promotes internal reflection. As shown in FIG. 4, the optical fiber core (402) can be coated with metal cladding (410) between the photosensitive regions (404, 406, 408). The optical fiber core is not coated with metal cladding or other non-radiation transmissive material in the photosensitive regions.

In some embodiments, an optoelectronic device having a fiber structure comprises a photovoltaic cell. In one embodiment, a photovoltaic cell comprises a fiber core, a radiation transmissive first electrode surrounding the fiber core, at least one photosensitive organic layer surrounding the first electrode and electrically connected to the first electrode, and a second electrode surrounding the organic layer and electrically connected to the organic layer. In another embodiment, the photovoltaic cell comprises a plurality of photosensitive organic layers as provided herein.

In a further embodiment, a photovoltaic cell comprises a fiber core comprising a plurality of photosensitive regions disposed along the longitudinal axis of the fiber core, each photosensitive region comprising a radiation transmissive first electrode surrounding the fiber core, at least one photosensitive organic layer surrounding the first electrode and electrically connected to the first electrode, and a second electrode surrounding the organic layer and electrically connected to the organic layer.

Fiber photovoltaic cells, according to embodiments of the present invention, are operable to receive electromagnetic radiation along the longitudinal axis of the optical fiber core. Electromagnetic radiation received along the longitudinal axis of the optical fiber core, in some embodiments, can be transmitted though the radiation transmissive first electrode and into the photosensitive organic layer through evanescence fields. In other embodiments, the received electromagnetic radiation can be scattered into the photosensitive organic layer by scattering agents within the optical fiber. In a further embodiment, at least a portion of the received electromagnetic radiation can undergo upconversion and be emitted into the photosensitive organic layer.

Fiber photovoltaic devices, according to some embodiments of the present invention, can display a fill factor greater than 0.2. In other embodiments, fiber photovoltaic devices can demonstrate a fill factor greater than 0.5. In a further embodiment, fiber photovoltaic devices can display a fill factor greater than 0.7.

In some embodiments, fiber photovoltaic devices of the present invention can display conversion efficiencies, $\eta_p$, greater than about 6%. Fiber photovoltaic devices, in other embodiments, can demonstrate conversion efficiencies greater than about 10%. In another embodiment, fiber photovoltaic devices can display conversion efficiencies greater than about 15%. In a further embodiment, fiber photovoltaic devices can display conversion efficiencies greater than 35%.

In some embodiments, the present invention provides an optoelectronic device comprising at least one pixel comprising at least one photovoltaic cell, the photovoltaic cell comprising a fiber core, a radiation transmissive first electrode surrounding the fiber core, at least one photosensitive organic layer surrounding the first electrode and electrically connected to the first electrode, and a second electrode surrounding the organic layer and electrically connected to the organic layer. In some embodiments, a photovoltaic cell of a pixel comprises a plurality of photosensitive organic layers.

In a further embodiment, a photovoltaic cell of a pixel comprises a fiber core comprising a plurality of photosensitive regions disposed along the longitudinal axis of the fiber core, each photosensitive region comprising a radiation transmissive first electrode surrounding the fiber core, at least one photosensitive organic layer surrounding the first electrode and electrically connected to the first electrode, and a second electrode surrounding the at least one organic layer and electrically connected to the organic layer.

In some embodiments, a pixel comprises a plurality of photovoltaic cells. In other embodiments, an optoelectronic device comprises an array of pixels. In a further embodiment, an optoelectronic device comprises an array of pixels, each pixel comprising a plurality of photovoltaic cells.

Fiber photovoltaic cells for use in pixel applications, in some embodiments of the present invention, are constructed independently from one another. In such embodiments, component materials for one fiber photovoltaic cell are selected without reference to component materials selected for another fiber photovoltaic cell. In one embodiment, for example, one fiber photovoltaic cell can comprise a glass optical fiber core while another photovoltaic cell can comprise a plastic optical fiber core. As a result, in some embodiments, pixels and pixel arrays are not required to comprise fiber photovoltaic cells of identical construction. Fiber photovoltaic cell construction can be varied in any manner consistent with the materials and methods described herein to produce pixels and pixel arrays suitable for a wide range of applications.

In some embodiments, a plurality of fiber photovoltaic cells can be bundled. In such embodiments, each fiber photovoltaic cell can constitute a single pixel or the plurality of fiber photovoltaic cells can collectively constitute a single pixel.

Figure 5:
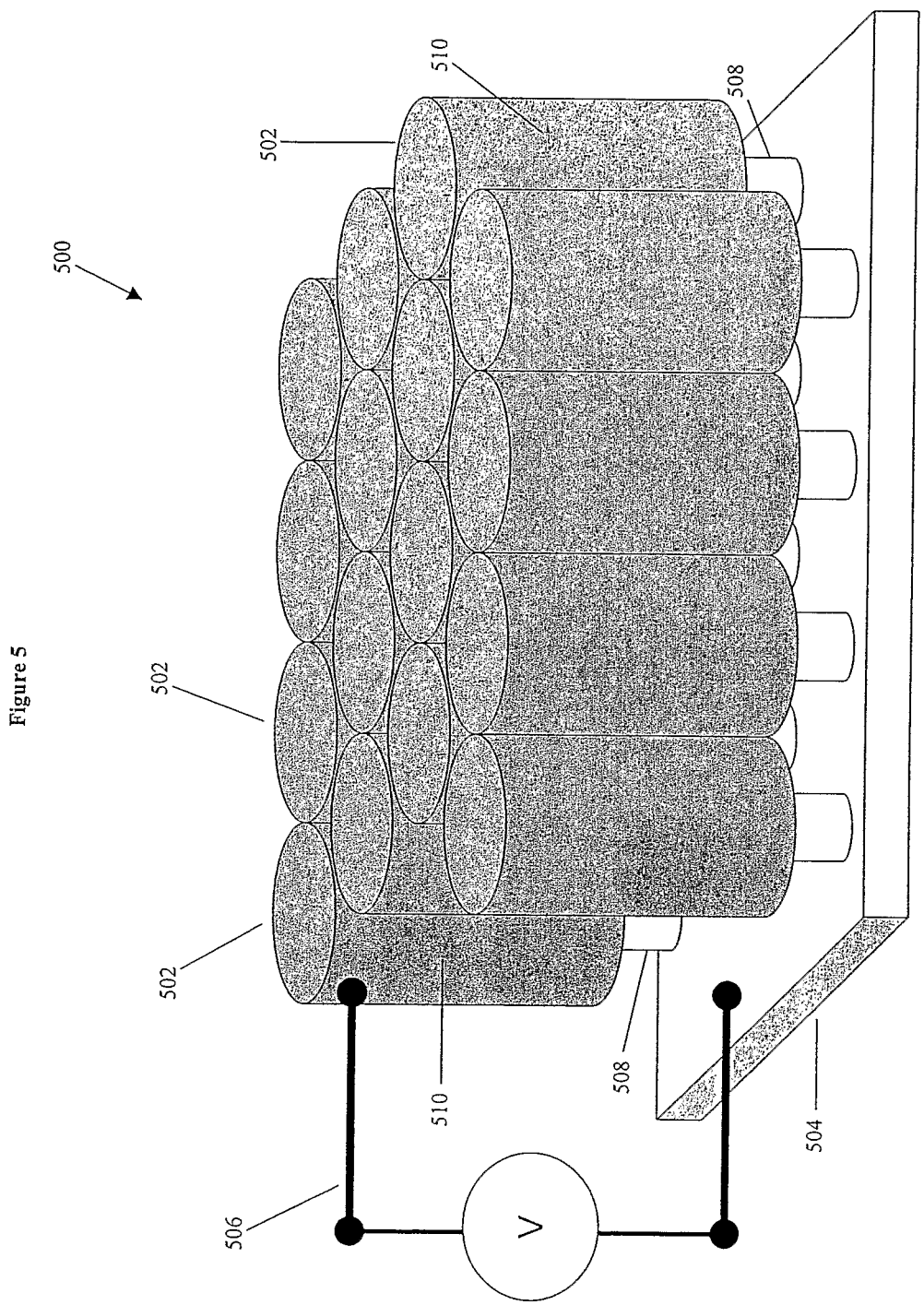
FIG. 5 illustrates a bundle of fiber photovoltaic cells according to an embodiment of the present invention.

FIG. 5 illustrates a bundle (500) of fiber photovoltaic cells (502) according to an embodiment of the present invention. The fiber photovoltaic cells (502) can be disposed on a connection plate (504) for incorporation into an external electrical circuit (506). Each fiber photovoltaic cell (502) is disposed on the connection plate (504) through a longitudinal extension (508) of the optical fiber core.

As illustrated in FIGS. 2 and 3, the longitudinal extension (508) of a fiber photovoltaic cell (502) can comprise the optical fiber core, the radiation transmissive first electrode, and any exciton blocking layers operable to transport desired excitons generated in photosensitive organic layers to the radiation transmissive first electrode. Connection to the external circuit (506) can be completed through the external metallic contacts (510) of the fiber photovoltaic cells (502).

In some embodiments, a photosensitive material can be used as a matrix in which to bundle a plurality of fiber photovoltaic cells. Photosensitive materials for bundling fiber photovoltaic cells can comprise polymeric materials. Polymeric materials suitable for use as a bundling matrix, in some embodiments, can comprise conjugated polymers such as thiophenes including poly(3-hexylthiophene) (P3HT) and poly(3-octylthiophene) (P3OT). In other embodiments, polymeric materials suitable for use as a bundling matrix can comprise semiconducting polymers as provided hereinabove, including PPV, PPy, and PAn.

In FIG. 5, for example, a photosensitive polymer, such as poly(3-hexylthiophene), can be disposed on the connection plate (504) and in the spaces between the fiber photovoltaic cells (502). The poly(3-hexylthiophene) can be in contact with the longitudinal extension (508) of the optical fiber core and the external metal contact (510) of each fiber photovoltaic cell (502). When exposed to electromagnetic radiation, the poly(3-hexylthiophene) matrix can generate excitons in addition to those generated by the fiber photovoltaic cells (502). The poly(3-hexylthiophene) matrix can transfer the additional excitons to the fiber photovoltaic cells (502) through the longitudinal extensions (508) of the optical fiber cores and the external metal contacts (510). Fiber photovoltaic cells (502) receiving excitons generated by the poly(3-hexylthiophene) matrix can subsequently transport the excitons into the external electrical circuit (506).

Optoelectronic devices comprising at least one pixel comprising at least one fiber photovoltaic cell, in some embodiments, comprise solar cells. Pixels and pixel arrays can be placed on any suitable substrate, in some embodiments, to produce solar panels. Solar cells and panels comprising fiber photovoltaic cells of the present invention can have conversion efficiencies greater than 6%.

The present invention also provides methods for producing optoelectronic devices comprising providing a fiber core, disposing a radiation transmissive first electrode on a surface of the fiber core, disposing at least one photosensitive organic layer in electrical communication with the first electrode, and disposing a second electrode in electrical communication with the organic layer. Materials suitable for the fiber core, radiation transmissive first electrode, photosensitive organic layer or layers, second electrode, protective layer, and external metallic contact, in embodiments of methods of the present invention, are consistent with those provided for optoelectronic devices having a fiber stricture described herein.

Disposing a radiation transmissive first electrode on a fiber core, in some embodiments, comprises sputtering or dip coating a radiation transmissive conductive oxide onto a surface of the fiber core. In some embodiments, disposing a photosensitive organic layer in electrical communication with the first electrode comprises depositing the organic layer on the first electrode by dip coating, spin coating, vapor phase deposition, or vacuum thermal annealing. Disposing a second electrode in electrical communication with the photosensitive organic layer, according to some embodiments, comprises depositing the second electrode on the organic layer through vapor phase deposition, spin coating, or dip coating.

Methods of producing an optoelectronic device, in some embodiments, further comprises annealing the photosensitive organic layer or layers. In some embodiments where a photosensitive organic layer comprises a composite material comprising a polymer phase and a nanoparticle phase, annealing the organic layer can produce higher degrees of crystallinity in both the polymer and nanoparticle phases as well as result in greater dispersion of the nanoparticle phase in the polymer phase. Nanoparticle phases comprising fullerenes, single-walled carbon nanotubes, multi-walled carbon nanotubes, or mixtures thereof can form nanowhiskers in the polymeric phase as a result of annealing. Annealing a photosensitive organic layer, according to some embodiments, can comprise heating the organic layer at a temperature ranging from about 80° C. to about 155° C. for a time period of ranging from about 1 minute to about 30 minutes. In some embodiments, a photosensitive organic layer can be heated for about 5 minutes.

In some embodiments, a method for producing an optoelectronic device further comprises disposing at least one upconverter and/or scattering agent in the fiber core.

In addition to methods of producing optoelectronic devices, the present invention also provides methods for converting electromagnetic energy into electrical energy. Waveguiding may be utilized to increase the efficiency of the conversion.

In an embodiment, the present invention provides a method for converting electromagnetic energy in the form of waves into electrical energy, the method comprising: receiving an electromagnetic wave; and guiding the electromagnetic wave to transmit radiation into a photosensitive layer. In some embodiments, guiding the electromagnetic wave to transmit radiation into a photosensitive organic layer can comprise creating total internal reflection of the electromagnetic wave at an interface of a photosensitive organic layer and an adjacent layer to produce evanescent waves or fields in the photosensitive organic layer.

In an embodiment, a method for converting electromagnetic energy into electrical energy comprises receiving radiation along the longitudinal axis of an optical fiber, transmitting the radiation into at least one photosensitive organic layer through a radiation transmissive electrode surrounding the optical fiber, generating excitons in the photosensitive organic layer, and separating the excitons into electrons and holes at a heterojunction in the organic layer.

In some embodiments, a heterojunction comprises a plurality of bulk heterojunctions. As discussed herein, a bulk heterojunction is formed at the interface of a donor material and an acceptor material. In some embodiments, a donor material comprises a polymeric phase and the acceptor material comprises a nanoparticle phase. Donor and acceptor materials for use in methods of the present invention are consistent with those provided herein for optoelectronic devices.

Electromagnetic radiation received along the longitudinal axis of an optical fiber, in some embodiments, comprises visible radiation. In other embodiments, radiation received along the longitudinal axis of an optical fiber comprises infrared radiation.

In some embodiments, transmitting electromagnetic radiation into a photosensitive organic layer comprises transmitting radiation through evanescence fields. In other embodiments, transmitting electromagnetic radiation into a photosensitive organic layer comprises upconverting at least a portion of the electromagnetic radiation received along the longitudinal axis of the optical fiber. Upconverting, according to embodiments of the present invention, comprises absorbing radiation received along the longitudinal axis of an optical fiber with an upconversion material to create an excited state and emitting radiation into at least one organic layer to relax the excited state, wherein the emitted radiation has a shorter wavelength than the absorbed radiation. In some embodiments, the portion of radiation absorbed by the upconversion material comprises infrared radiation.

In a further embodiment, transmitting the radiation received along the longitudinal axis of an optical fiber into a photosensitive organic layer comprises scattering the radiation into the organic layer with a scattering agent.

A method for converting electromagnetic energy into electrical energy, according to embodiments of the present invention, can further comprise removing the electrons into an external circuit.

The present invention will now illustrated by the following non-limiting example.

EXAMPLE 1

Fiber Photovoltaic Cell

A non-limiting example of a fiber photovoltaic cell was prepared according to the following procedure.

The jacket of a multi-mode fiber (BFH37, High OH, from 1.5 mm to 0.6 mm, from Thorlabs) was stripped off with a razor. The hard polymer cladding was burned away with a torch flame. The core of the fiber was then cleaned in an ultrasonic bath with deionized water, acetone, isopropyl alcohol successively for 20 min, and dried in oven for 15 min at 100° C. The cleaned fiber was subsequently coated with indium-tin-oxide (In/Sn=90:10) by dip coating (over 10 layers). See Dip Coated ITO thin films through sol-gel process using metal salts, Sutapa Roy Ramanan, *Thin Solid Films*, 389 (2001), 207.

The ITO coated fiber was thoroughly cleaned in an ultrasonic bath with acetone and isopropyl alcohol successively for 20 min, and dried in oven at 100° C. The fiber was then exposed to ozone for 90 min (rotating the fiber 3 times every after 30 min). A PEDOT:PSS solution (Baytron P from Bayer) was subsequently deposited on the fiber by dip coating and dried at 100° C. for 15 min. (the thickness of PEDOT:PSS film was about 150 nm).

Subsequently, a solution of P3HT (American Dye):PCBM (American Dye)=1:0.8 in chlorobenzene was deposited on the fiber through dip coating. (the thickness of polymer film was about 300 nm). In the final steps, LiF and Al electrodes were deposited via thermal evaporation at the pressure of $10^{-6}$ torr. The thickness of LiF was about 0.3-0.4 nm, and the thickness of Al film was about 100 nm. The length of the fiber with active area is about 1.4 cm.

Figure 6:
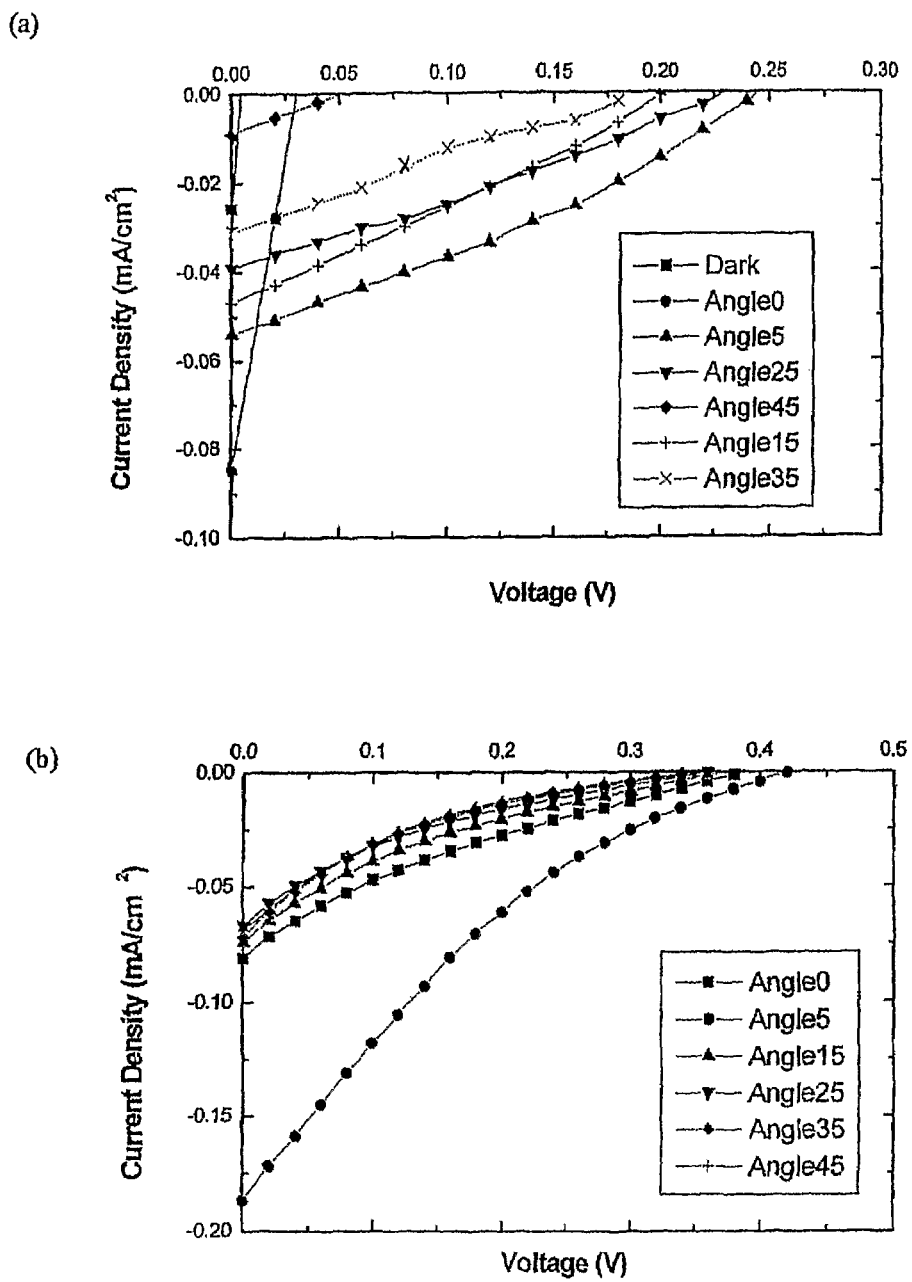
FIG. 6 displays current-voltage plots for a fiber photovoltaic device according to an embodiment of the present invention.

After preparation, the fiber photovoltaic cell was characterized in terms of current density, open circuit voltage, short circuit current, and efficiency. FIG. 6 displays current-voltage plots for the fiber photovoltaic cell in relation to radiation coupling angle. FIG. 6(a) displays a current-voltage plot for the fiber photovoltaic cell prior to annealing the photosensitive organic layer, and FIG. 6(b) displays a current-voltage plot for the fiber photovoltaic cell subsequent to annealing the photosensitive organic layer.

Figure 7:
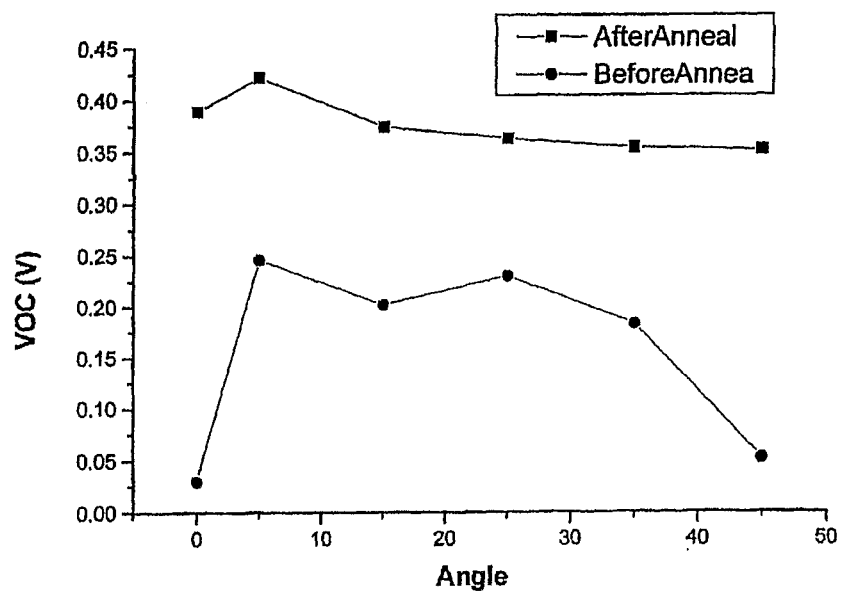
FIG. 7 displays open circuit voltages for a fiber photovoltaic device according to an embodiment of the present invention.

FIG. 7 demonstrates open circuit voltage ($V_{oc}$) versus radiation coupling angle for the fiber photovoltaic cell prior to annealing the photosensitive organic layer and subsequent to annealing the photosensitive organic layer. As displayed in the plot, annealing the photosensitive organic layer increases the open circuit voltage of the fiber photovoltaic cell.

Figure 8:
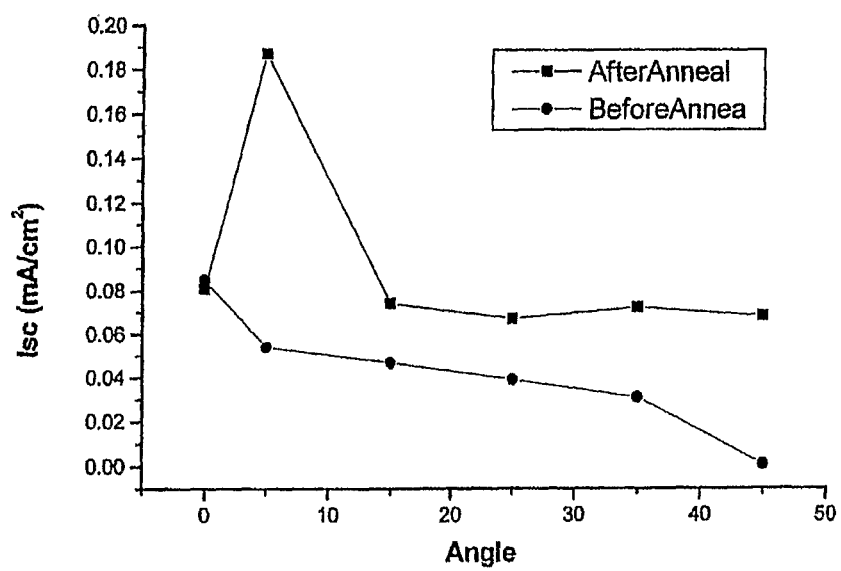
FIG. 8 displays short circuit currents for a fiber photovoltaic device according to an embodiment of the present invention.

FIG. 8 displays short circuit current ($I_{sc}$) versus radiation coupling angle for the fiber photovoltaic cell prior to annealing the photosensitive organic layer and subsequent to annealing the photosensitive organic layer. As with the open circuit voltage, the short circuit current of the fiber photovoltaic cell increases after annealing the photosensitive organic layer.

Figure 9:
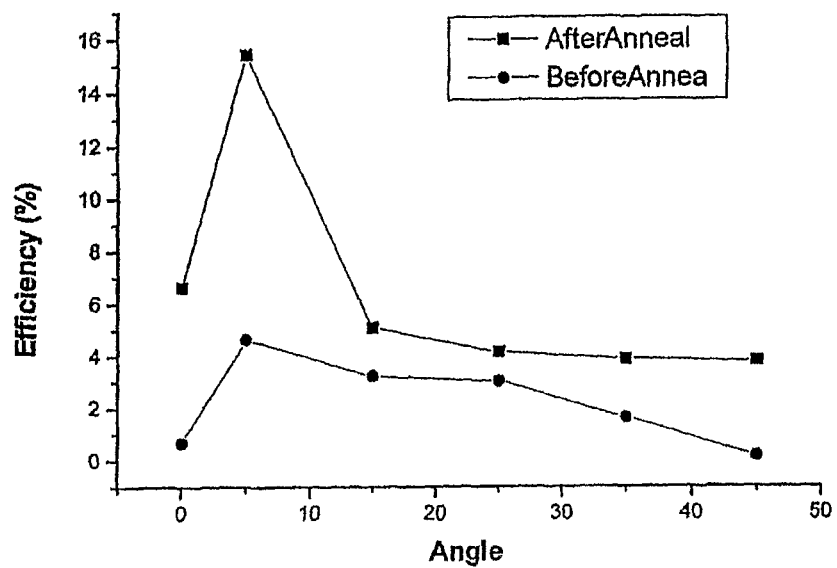
FIG. 9 displays conversion efficiencies for a fiber photovoltaic device according to an embodiment of the present invention.

FIG. 9 displays conversion efficiency versus radiation coupling angle for the fiber photovoltaic cell prior to annealing the photosensitive organic layer and subsequent to annealing the photosensitive organic layer. Consistent with the pattern displayed by in the previous figures, FIG. 5 demonstrates an increased conversion efficiency for the fiber photovoltaic subsequent to annealing.

Various embodiments of the invention have been described in fulfillment of the various objects of the invention. It should That which is claimed is:

1. An apparatus comprising:
   an optical fiber core;
   a radiation transmissive first electrode surrounding the fiber core;
   at least one photosensitive organic layer surrounding the first electrode and electrically connected to the first electrode; and
   a second electrode enclosing the photosensitive organic layer and electrically connected to the photosensitive organic layer, wherein
   the second electrode is a reflective and continuous metal layer having a thickness of 100 nm to 1 µm; or
   wherein the apparatus comprises a reflective and continuous external metal contact enclosing the second electrode; or
   wherein the second electrode is reflective and the apparatus comprises a reflective and continuous external metal contact enclosing the second electrode, wherein the apparatus is operable to pass radiation into the photosensitive organic layer from an interior of the optical fiber core.

2. The apparatus of claim 1, wherein the optical fiber comprises a glass optical fiber, quartz optical fiber, or a plastic optical fiber.

3. The apparatus of claim 1, wherein the radiation transmissive first electrode comprises a radiation transmissive conducting oxide.

4. The apparatus of claim 3, wherein the radiation transmissive conducting oxide comprises indium tin oxide, gallium indium tin oxide, or zinc indium tin oxide.

5. The apparatus of claim 1, wherein the photosensitive organic layer comprises a photoactive region.

6. The apparatus of claim 5, wherein the photoactive region comprises at least one bulk heterojunction between a donor material and an acceptor material.

7. The apparatus of claim 6, wherein the donor material comprises a polymeric phase and the acceptor material comprises a nanoparticle phase.

8. The apparatus of claim 7, wherein the polymeric phase comprises a conjugated polymer.

9. The apparatus of claim 8, wherein the conjugated polymer comprises poly(3-hexylthiophene), poly(3-octylthiophene), or mixtures thereof.

10. The apparatus of claim 7, wherein the nanoparticle phase comprises fullerenes, carbon nanotubes, or mixtures thereof.

11. The apparatus of claim 10, wherein the fullerenes comprise 1-(3-methoxycarbonyl)propyl-1-phenyl(6,6)$C_{61}$.

12. The apparatus of claim 6, wherein the donor material comprises organometallic compounds.

13. The apparatus of claim 12, wherein the organometallic compounds comprise phthalocyanines, porphyrins, or derivatives thereof.

14. The apparatus of claim 6, wherein the acceptor material comprises perylenes, naphthalenes, fullerenes, or nanotubes.

15. The apparatus of claim 1, wherein the metal of the second electrode comprises aluminum, gold, silver, or copper.

16. The apparatus of claim 1 further comprising at least one blocking layer.

17. The apparatus of claim 16, wherein the at least one blocking layer comprises a polymeric composite comprising a nanoparticle phase dispersed in a polymeric phase.

18. The apparatus of claim 17, wherein the polymeric composite comprises a plurality of nanotubes or fullerenes dispersed in poly(3,4-ethylenedioxythiophene).

19. The apparatus of claim 17, wherein the polymeric composite comprises a plurality of nanotubes or fullerenes dispersed in poly(vinylidene fluoride).

20. The apparatus of claim 1 further comprising a protective layer surrounding the second electrode.

21. The apparatus of claim 20, wherein the protective layer comprises a polymeric composite material.

22. The apparatus of claim 21, wherein the polymeric composite material comprises carbon nanoparticles dispersed in poly(vinylidene chloride).

23. The apparatus of claim 1, wherein the optical fiber core comprises at least one upconversion material.

24. The apparatus of claim 23, wherein the at least one upconversion material comprises a Lanthanide series element.

25. The apparatus of claim 24, wherein the at least one upconversion material comprises erbium, ytterbium, dysprosium, holmium, or mixtures thereof.

26. The apparatus of claim 23, wherein the at least one upconversion material comprises at least one nanoparticle comprising at least one Lanthanide series element.

27. The apparatus of claim 1, wherein the optical fiber core comprises at least one scattering agent.

28. The apparatus of claim 1, wherein the fiber core has a diameter ranging from about 100 µm to about 2 mm.

29. The apparatus of claim 1, wherein the fiber core has a length ranging from about 10 µm to about 1 mm.

30. The apparatus of claim 1, wherein the radiation transmissive first electrode has a thickness ranging from about 100 nm to about 1 µm.

31. The apparatus of claim 1, wherein the organic layer has a thickness ranging from about 30 nm to about 1 µm.

32. The apparatus of claim 1, wherein the second electrode has a thickness ranging from about 5 nm to about 1 µm.

33. The apparatus of claim 1, wherein the apparatus is flexible.

34. The apparatus of claim 1, wherein the apparatus is a photovoltaic cell.

35. The photovoltaic cell of claim 34 having a conversion efficiency greater than 6%.

36. The photovoltaic cell of claim 34, having a conversion efficiency greater than 10%.

37. The apparatus of claim 34, wherein the photovoltaic cell has a fill factor greater than 0.2.

38. The apparatus of claim 34, wherein the photovoltaic cell has a fill factor greater than 0.5.

39. A method of producing a photovoltaic cell comprising:
   providing an optical fiber core;
   disposing a radiation transmissive first electrode on a surface of the core;
   disposing at least one photosensitive organic layer in electrical communication with the first electrode; and
   disposing a metal second electrode having a thickness of 100 nm to 1 µm in electrical communication with the photosensitive organic layer, the metal second electrode being a reflective and continuous metal layer enclosing the photosensitive organic layer; or disposing a second electrode in electrical communication with the photosensitive organic layer and a reflective and continuous external metal contact enclosing the second electrode; or disposing a reflective second electrode in electrical communication with the photosensitive organic layer and a reflective and continuous external metal contact enclosing the reflective second electrode, wherein the photovoltaic cell is operable to pass radiation into the photosensitive organic layer from an interior of the optical fiber core.

40. The method of claim 39, wherein the radiation transmissive first electrode comprises a radiation transmissive conducting oxide.

41. The method of claim 40, wherein the radiation transmissive conducting oxide comprises indium tin oxide, gallium indium tin oxide, or zinc indium tin oxide.

42. The method of claim 39, wherein the photosensitive organic layer comprises a photoactive region.

43. The method of claim 42, wherein the photoactive region comprises at least one bulk heterojunction between a donor material and an acceptor material.

44. The method of claim 43, wherein the donor material comprises a polymeric phase and the acceptor material comprises a nanoparticle phase.

45. The method of claim 44, wherein the donor material comprises an organometallic compound and the acceptor material comprises perylenes, naphthalenes, fullerenes, or nanotubes.

46. The method of claim 39 further comprising annealing the photosensitive organic layer to produce nanowhiskers in the organic layer.

47. The method of claim 46, wherein the nanowhiskers comprise crystalline 1-(3-methoxycarbonyl)propyl-1-phenyl $(6,6)C_{61}$.

48. The method of claim 39, wherein disposing a radiation transmissive first electrode comprises sputtering or dip coating a radiation transmissive conductive oxide onto the surface of the core.

49. The method of claim 39, wherein disposing an organic layer in electrical communication with the first electrode comprises depositing the organic layer on the first electrode by dip coating, spin coating, vapor phase deposition, or vacuum thermal evaporation.

50. The method of claim 39, wherein disposing a second electrode in electrical communication with the organic layer comprises depositing the second electrode on the organic layer through vapor phase deposition, spin coating, or dip coating.

51. The method of claim 39 further comprising providing at least one upconverter in the optical fiber.

52. The method of claim 39 further comprising providing at least one scattering agent in the optical fiber.

53. An apparatus comprising:
an optical fiber core;
a radiation transmissive first electrode surrounding the fiber core;
a plurality of photosensitive organic layers surrounding the first electrode and electrically connected to the first electrode; and
a second electrode enclosing the plurality of photosensitive organic layers and electrically connected to the plurality of photosensitive organic layers, wherein
the second electrode is a reflective and continuous metal layer having a thickness of 100 nm to 1 µm; or wherein the apparatus comprises a reflective and continuous external metal contact enclosing the second electrode; or wherein the second electrode is reflective and the apparatus comprises a reflective and continuous external metal contact enclosing the second electrode, wherein the apparatus is operable to pass radiation into the plurality of photosensitive organic layers from an interior of the optical fiber core.

54. The apparatus of claim 53, further comprising at least one buffer layer disposed between the plurality of photosensitive organic layers.

55. The apparatus of claim 54, wherein the at least one buffer layer comprises a charge transfer layer.

56. The apparatus of claim 55, wherein the charge transfer layer comprises an exciton blocking layer.

57. An apparatus comprising:
an optical fiber core;
a plurality of photosensitive regions disposed along the longitudinal axis of the fiber core, each photosensitive region comprising:
a radiation transmissive first electrode surrounding the fiber core;
at least one photosensitive organic layer surrounding the first electrode and;
a second electrode surrounding the organic layer and electrically connected to the organic layer,
wherein the optical fiber core is coated with a non-radiation transmissive material between the photosensitive regions and wherein the apparatus is operable to pass radiation into the plurality of photosensitive regions from an interior of the optical fiber core.

58. An apparatus comprising:
an optical fiber core;
a radiation transmissive first electrode surrounding the fiber core;
at least one photosensitive organic layer surrounding the first electrode and electrically connected to the first electrode; and
a metal second electrode having a thickness ranging from about 100 nm to about 1 µm enclosing the organic layer and electrically connected to the organic layer, the metal second electrode being a reflective and continuous metal layer,
wherein the apparatus is operable to pass radiation into the photosensitive organic layer from an interior of the optical fiber core.

59. An apparatus comprising:
an optical fiber core;
a radiation transmissive first electrode surrounding the fiber core;
at least one photosensitive organic layer surrounding the first electrode and electrically connected to the first electrode;
a second electrode surrounding the photosensitive organic layer and electrically connected to the photosensitive organic layer; and
a reflective and continuous external metal contact enclosing the second electrode,
wherein the apparatus is operable to pass radiation into the photosensitive organic layer from an interior of the optical fiber core.

* * * * *